(12) United States Patent
Liou et al.

(10) Patent No.: US 6,436,751 B1
(45) Date of Patent: Aug. 20, 2002

(54) FABRICATION METHOD AND STRUCTURE OF A FLASH MEMORY

(75) Inventors: Jih-Wei Liou; Hwi-Huang Chen, both of Hsinchu; Yen-Chang Chen, Ping-Tung; Pao-Chuan Lin, Yunlin Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/784,229

(22) Filed: Feb. 13, 2001

(51) Int. Cl.[7] .......................................... H01L 21/8238
(52) U.S. Cl. ........................................ 438/211; 438/264
(58) Field of Search ............................... 438/211, 257, 438/259, 264, 296, 427, 593, 594, 633, 262, 478, 524, 526, 701

(56) References Cited

U.S. PATENT DOCUMENTS 5,175,122 A * 12/1992 Wang et al. ................. 438/427
5,923,073 A * 7/1999 Aoki et al. ................... 257/701
6,261,905 B1 * 7/2001 Chen et al. ................... 438/264
6,265,292 B1 * 7/2001 Parat et al. ................... 438/264

* cited by examiner

Primary Examiner—Hoai V. Ho
Assistant Examiner—Phuc T. Dang
(74) Attorney, Agent, or Firm—J.C. Patents

(57) ABSTRACT

A fabrication method and a structure of a flash memory. Several first shallow trench isolations and second shallow trench isolations are formed in a memory circuit region and a peripheral circuit region of a substrate, respectively. The first shallow trench isolations are shallower than the second shallow trench isolations. Several gates are formed along a direction perpendicular to the substrate in the memory circuit region. A self-aligned source region process is performed to remove the isolation layer within every other first shallow trench isolations between the gates. A common source region and a column of separate drain regions are thus alternatively formed between the gates. The drain regions in the same column are isolated by the first shallow trench isolations.

20 Claims, 5 Drawing Sheets

FABRICATION METHOD AND STRUCTURE OF A FLASH MEMORY

BACKGROUND OF THE INVENTION

1. Field of the Invention

The invention relates in general to a method of fabricating a memory. More particularly, this invention relates to a method of fabricating a flash memory.

2. Description of the Related Art

A flash memory is a kind of non-volatile memory (NVM) with the characteristics of a small dimension, fast access speed and low power consumption. Since the data erasing is performed in a "block by block" fashion, the operation speed is faster than other memory.

The basic structure of the flash memory comprises a stacked gate structure assembled by a tunnel oxide layer, a floating gate, a dielectric layer and a control gate, and a source/drain region in the substrate at two sides of the stacked gate structure. In addition, the flash memory further comprises a peripheral circuit memory around the memory circuit region to integrate the peripheral devices for data writing/erasing/reading.

Many flash memories use an intercrossing control gate line and a bit line that connect to the drain region to control the write operation of an individual memory cell, and the source regions at the other side of the control gate are connected to each other. In this kind of flash memory, in order to save the volume occupied by the interconnect structure between the source region, the shallow trench isolations between the gates are removed. An ion implantation step is then performed to form a common source, also referred to as a buried source line. In this method, a self-aligned source (SAS) process is performed. That is, the shallow trench isolation between every other pair of gates has to be removed.

In the conventional fabrication process of a flash memory, the shallow trench isolations in both the memory circuit region and the peripheral circuit region are formed in the same photolithography and etching process. Therefore, the depth and topography for the shallow trench isolations in both regions are the same. A high voltage is typically required for the write/erase operation of a flash memory. Thus, for a process under 0.25 micron, the depth for the shallow trench isolation in the peripheral circuit region that controls the write/erase function has to be deeper than 0.4 microns to provide a sufficient isolation effect.

In the self-aligned source process, as the photoresist layer covering the gates is always narrower than the width of the gate, a portion of the gate is exposed. In order to remove a shallow trench isolation deeper than 0.4 micron, the exposed gate is inevitably damaged. In addition, as the shallow trench isolation is typically formed with an inclined sidewall and a rounded bottom surface to release stress, an isolation structure having a width of about 0.35 micron is required to have a depth larger than 0.4 micron. The above features decrease the integration of the flash memory.

SUMMARY OF THE INVENTION

The invention provides a method of fabricating a flash memory. A plurality of first shallow trench isolations is formed in a memory circuit region on a substrate, and a plurality of second shallow trenches is formed in a peripheral circuit region on the substrate. The second shallow trench isolations are deeper than the first shallow trench isolations. A plurality of stacked gates is formed on the substrate in the memory circuit region along a direction perpendicular to the shallow trench isolations. Each stacked gate comprises a tunneling oxide layer, a floating gate, a dielectric layer and a control gate. The first shallow trench isolations located between every other pair of the stacked gates are removed. A self-aligned source process is performed to form a common source region between every other pair of the stacked gates, while a column of separate drain regions is also formed between every alternate pair of the stacked gates. The drain regions in the same column are separated from each other by the first shallow trench isolations.

The invention further provides a structure of a flash memory. A substrate comprises a memory circuit region and a peripheral circuit region comprises a plurality of second shallow trench isolations. The memory circuit region comprises a plurality of stacked gates, preferably parallel to each other on the substrate. A common source and a column of drain regions are formed in the substrate between every alternate pair of the stacked gates. The drain regions in the same column are separated from each other by a plurality of first shallow trench isolations. The peripheral circuit region comprises a plurality of second shallow trench isolations deeper than the first shallow trench isolations.

As mentioned above, the first shallow trench isolations formed in the memory circuit region are shallower than the shallow trench isolations formed in the peripheral circuit region. Therefore, the damage to the gate during the removal step of the shallow trench isolations in the memory circuit region is minimized, or even prevented. In addition, as the shallow trench isolations formed in the memory circuit region are shallower, the required width is also reduced, so that the integration of the flash memory is increased. The shallow trench isolations formed in the peripheral circuit are maintained at a required depth, so that the operation speed is not affected while the integration is enhanced. Furthermore, as the shallow trench isolations are shallower in the memory circuit region, the common source formed after removing the shallow trench isolation region is formed with a less uneven profile, so that the electrical performance is enhanced.

Both the foregoing general description and the following detailed description are exemplary and explanatory only and are not restrictive of the invention, as claimed.

DESCRIPTION OF THE PREFERRED EMBODIMENTS

Figure 1:
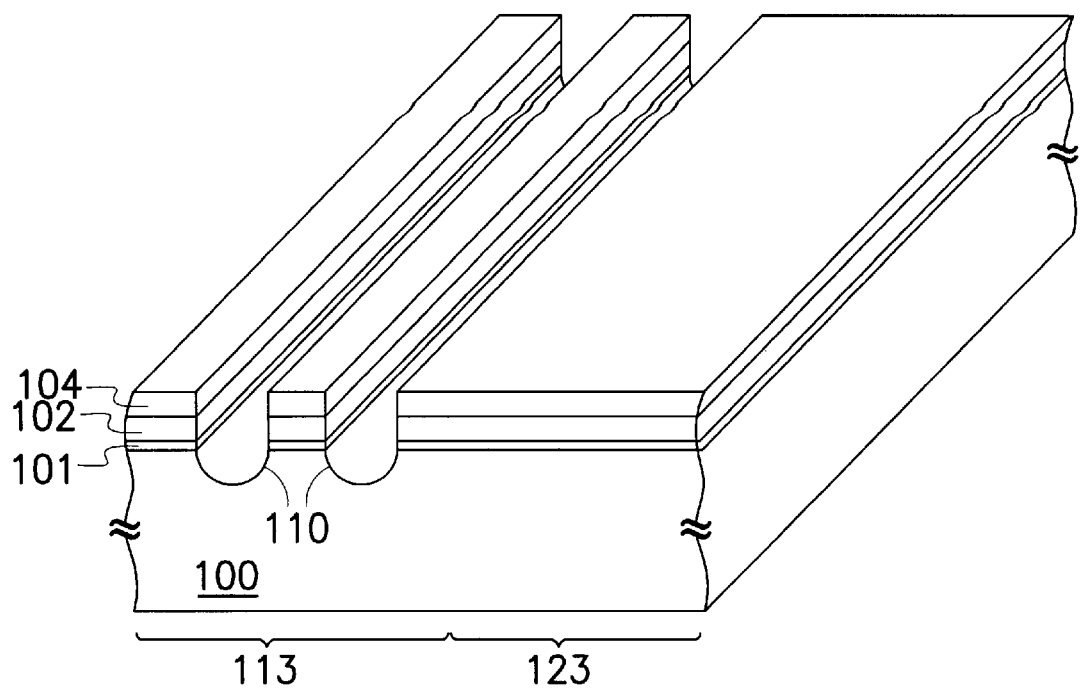
FIGS. 1–5 are three-dimensional graphs showing the flash memory during different fabrication process stage according to the invention.

In FIG. 1, a substrate 100 having a memory circuit region 113 and a peripheral circuit region 123 is provided. A pad oxide layer 101 and a mask layer 102, for example, a silicon nitride layer, are formed on the substrate 100. A photoresist layer 104 is formed on the mask layer 102. The photoresist layer 104 comprises a pattern that expose a portion of the mask layer 102 in the memory circuit region 113, while the peripheral circuit region 123 is completely covered.

Preferably, the pattern of the photoresist layer 104 expose a plurality of parallel strips of the mask layer 102 as shown in FIG. 1. The exposed mask layer 102, the pad oxide layer 101 and the substrate 100 under the exposed mask layer 102 are etched to form a plurality of trenches 110 in the memory circuit regions 113. Again, the trenches 110 are formed as a plurality of parallel strips in the substrate 100. Preferably, the trenches 110 have a depth between about 0.1 micron to about 0.3 micron and a width less than about 0.25 micron. The profiles of the trenches 110 are rounded to release stress.

Figure 2:
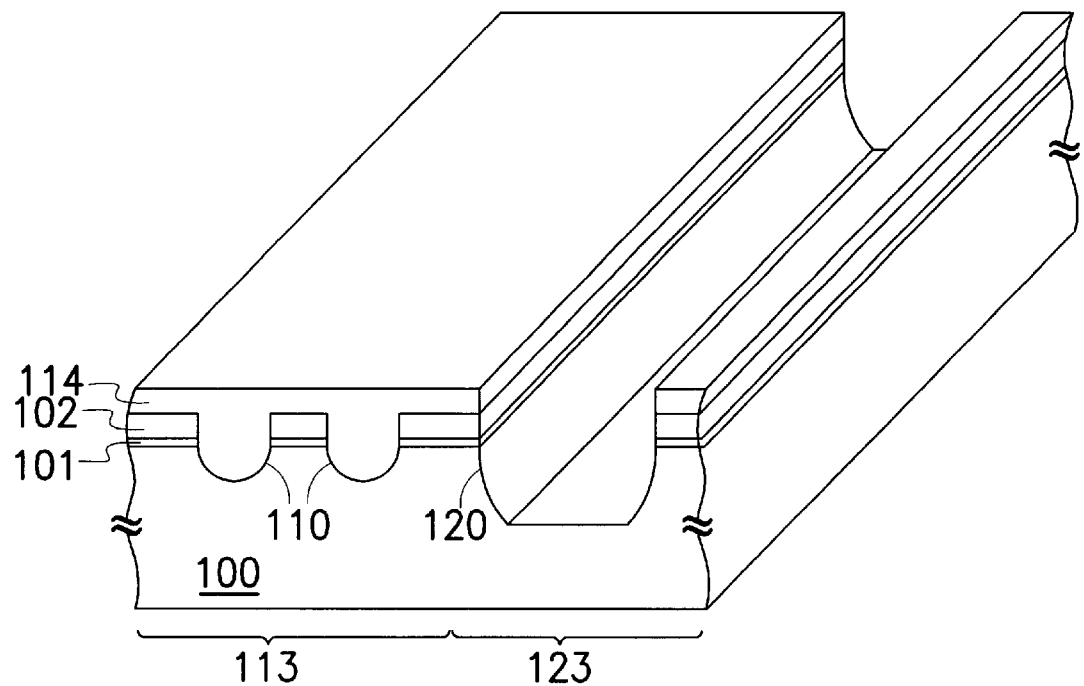

In FIG. 2, the photoresist layer 104 is removed, and a photoresist layer 114 is formed to completely cover the memory circuit region 113 and a portion of the peripheral circuit region 123. The photoresist layer 114 has a pattern to expose a portion of the mask layer 102 in the peripheral circuit region 123. Using the photoresist layer 114 as a mask, the exposed mask layer 102, the pad oxide layer 101 and the substrate 100 under the exposed mask layer 102 are etched to form at least a trench 120 in the peripheral circuit region 123. The trench 120 has an inclined sidewall and a rounded surface to release stress. The depth of the trench 120 is larger than about 0.4 micron, and the width thereof is larger than about 0.35 micron. The high operation voltage devices in the peripheral circuit region 123 can thus have a better isolation effect.

Figure 3:
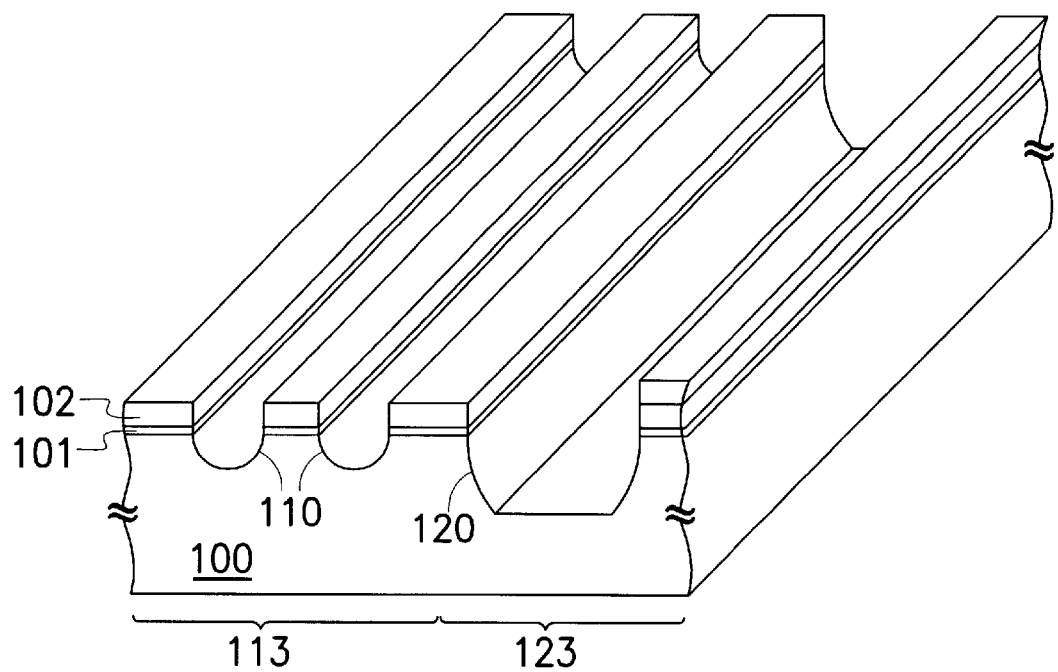
Figure 4:
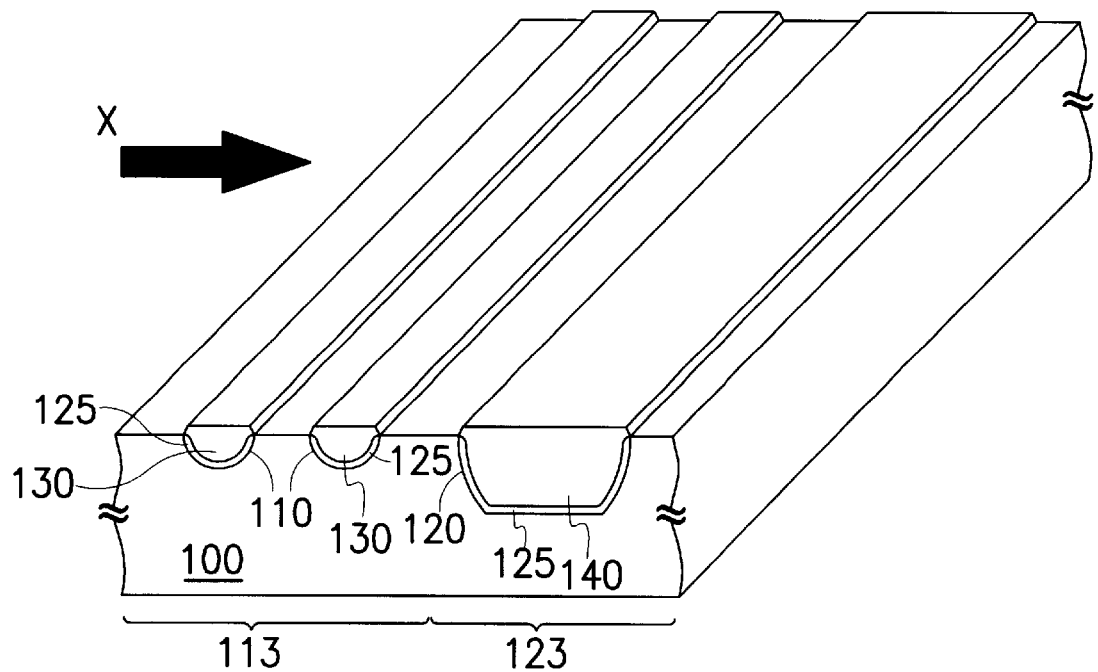

In FIG. 3, the photoresist layer 114 is removed to expose the surfaces of the trenches 110 and 120. In FIG. 4, a liner oxide layer 125 is formed along the surfaces of the trenches 110 and 120. The trenches 110 and 120 are then filled with an insulating material as the shallow trench isolations 130 and 140. The steps of filling the trenches 110 and 120 include forming the insulating material layer on the mask layer 102 to fill the trenches 110 and 120, followed by a step of chemical mechanical polishing (CMP). The insulating material includes a silicon oxide formed by chemical vapor deposition (CVD). After filling the insulating material, a step of annealing is performed to density the insulating material. The mask layer 102 and the pad oxide layer 101 are then removed to expose the substrate 100.

Figure 5:
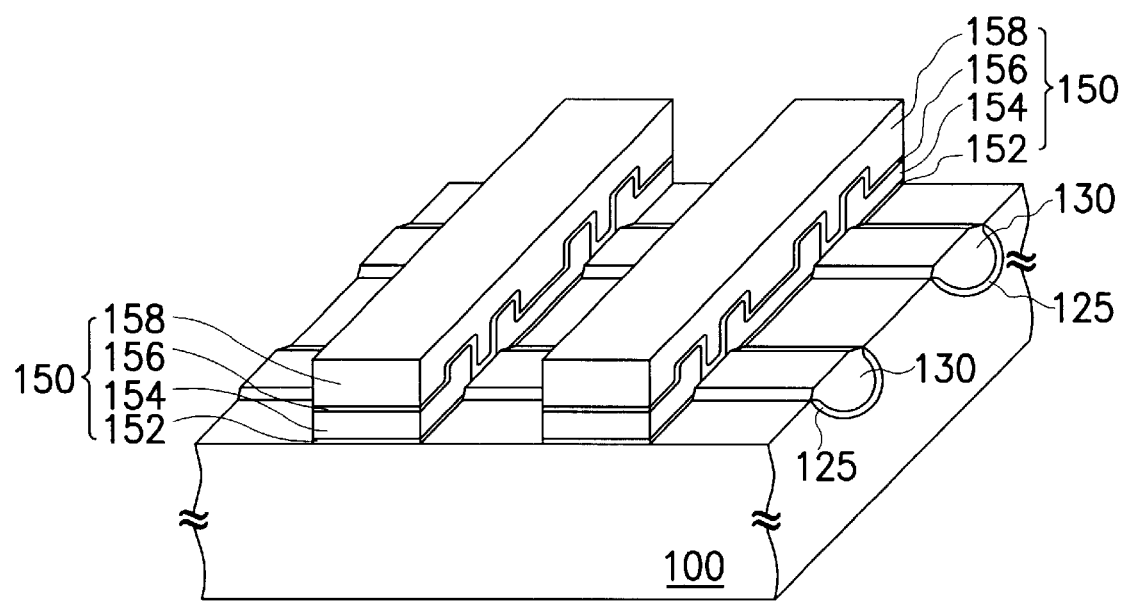

In FIG. 5, a plurality of stacked gates 150 are formed in the memory circuit region 113 along a direction perpendicular to the shallow trench isolations 130. Each of the stacked gates 150 comprises a tunneling oxide layer 152, a floating gate 154, a dielectric layer 156 and a control gate 158. The tunneling oxide layer 152 is formed across each of the shallow trench isolations 130. The floating gates 154 formed on the tunneling oxide layers 152 comprise polysilicon layers. The dielectric layers 156, for example, a composite layer of oxide/nitride/oxide, are formed on the floating gates 154. The control gates 158 are formed on the dielectric layers 156 with a material, for example, polysilicon.

Figure 6:
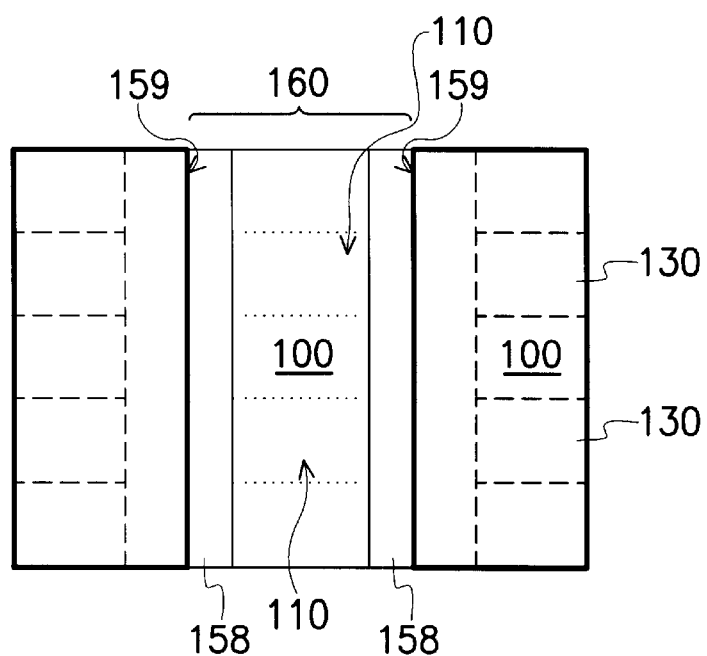
FIG. 6 and FIG. 7A are top views showing the fabrication process following FIG. 5.

In FIG. 6, a self-aligned source process is performed. A photoresist layer 159 (the frames drawn with bold lines) is formed to cover the central portion of the stacked gates 150. The photoresist layer 159 has an opening over each of the shallow trench isolations 130 between every other pair of the stacked gates 150. The openings of the photoresist layer 159 are wider than the shallow trench isolations 130 between every pair of the stacked gates 150 to ensure that the shallow trench isolations 130 are completely exposed. As a result, an edge portion of the control gates 158 is exposed. The exposed shallow trench isolations 130 are then removed to expose the substrate 100 in the trench 110 at which the shallow trench isolations 130 are removed.

Figure 7A:
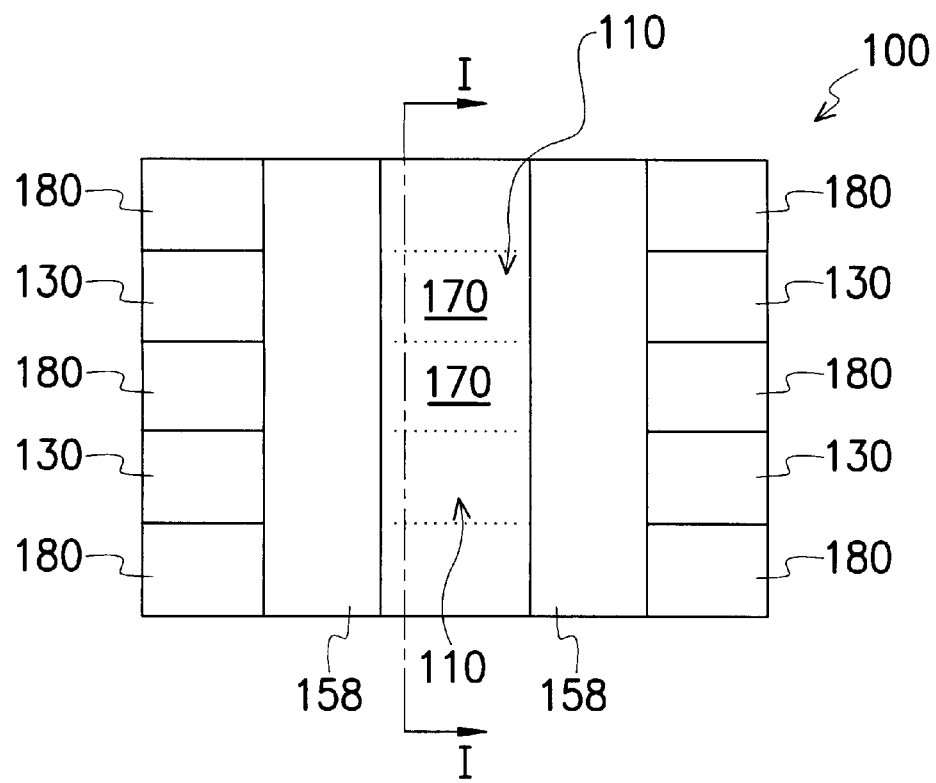
Figure 7B:
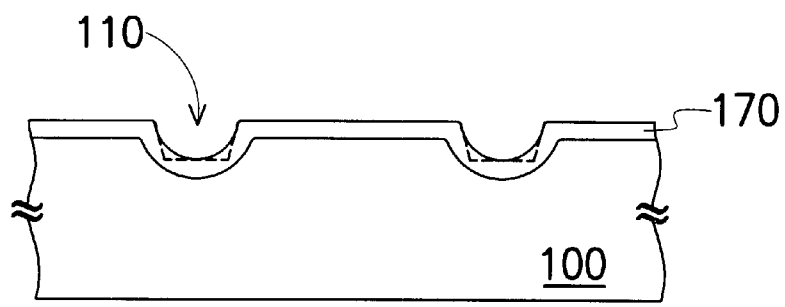
FIG. 7B is a cross sectional view along the cutting I—I in FIG. 7A.

In FIG. 7A, the photoresist layer 159 is removed. The exposed substrate 100 is doped using the stacked gates 150 as a mask. As a result, FIGS. 7A–7B show that a common source region 170 is formed in the substrate 100 between every other pair of the stacked gates 150. Simultaneously, a column of a plurality of drain regions 180 is formed in the substrate 100 between every alternate pair of the stacked gates 158. The drain regions 180 in the same column are separated from each other by the remaining shallow trench isolations 130.

Figure 7C:
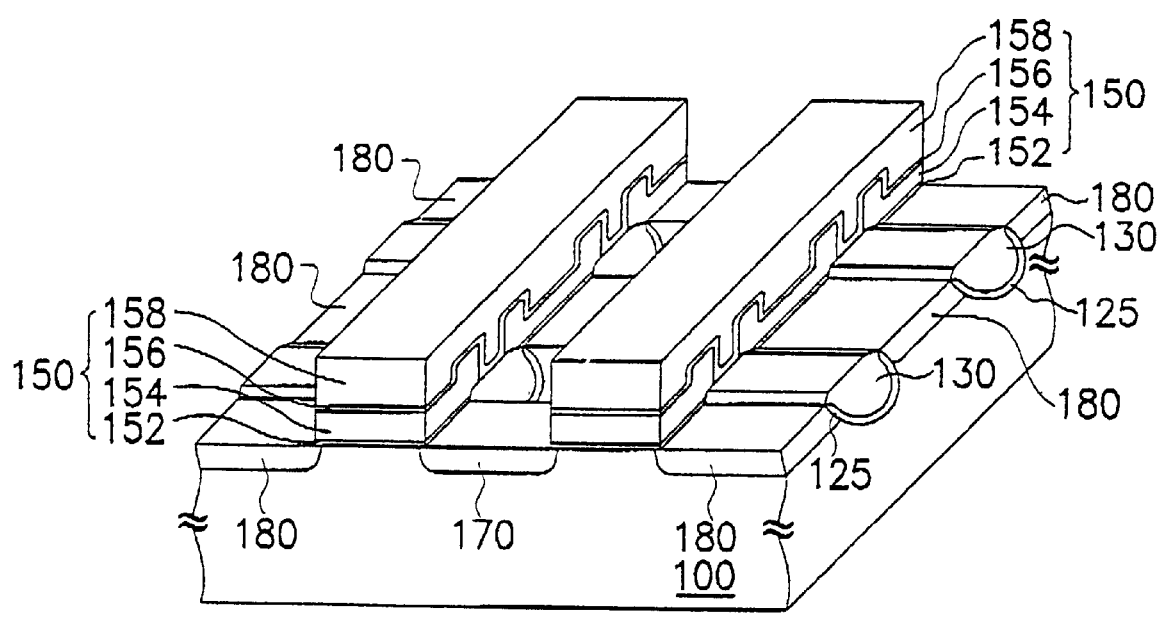
FIG. 7C is a three dimensional view of FIGS. 7A and 7B.

FIG. 7C illustrates a three-dimensional view of FIGS. 7A and 7B. Referring to FIG. 7C, the portions of the shallow trench isolations 130 located between the stacked gates 150 are removed. The source regions 170 are formed in between each pair of stacked gates 150 while the drain regions 180 are formed in between every alternate pair of the stacked gates 158.

In the invention, the shallow trench isolations formed in the memory circuit region are shallower and narrower than the shallow trench isolations formed in the peripheral circuit region; therefore, the integration is enhanced without affecting the operation of the high voltage devices formed in the peripheral circuit region.

In addition to the enhancement of the integration, the smaller shallow trench isolations to be removed can prevent damage of the control gates of the stacked gates.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a flash memory, comprising:
   providing a substrate having a memory circuit region and a peripheral circuit region;
   forming a plurality of first shallow trench isolations and a plurality of second shallow trench isolations in the memory circuit region and the peripheral circuit region, respectively, wherein every first shallow trench isolations has a narrower width and a shallower depth than every second shallow trench isolations;
   forming a plurality of stacked gates on the substrate in the memory circuit region, wherein each stack gate is formed by stacking a plurality of tunnel oxide layers, a plurality of floating gates, a dielectric layer, and a control gate, with the control gate being stacked along a direction perpendicular to the first shallow trench isolations;
   removing portions of the first shallow trench isolations between every pair of the stacked gates; and
   performing a self-aligned source process to form a common source region and a column of a plurality of drain regions in the substrate between each pairs of the stacked gates.

2. The method according to claim 1, wherein the step of forming the first and second shallow trench isolations comprises a step of forming the first and second shallow trench isolations with rounded surfaces.

3. The method according to claim 1, wherein the step of forming the first and second shallow trench isolations further comprises:
   forming a mask layer on the substrate;
   performing two photolithography and etching processes to form a plurality of first trenches in the memory circuit region and at least a second trench in the peripheral circuit region, wherein the first trenches are shallower than the second trench;

filling the first and second trenches with an insulating material; and removing the mask layer.

4. The method according to claim 3, comprising further forming a pad oxide layer between the substrate and the mask layer.

5. The method according to claim 3, comprising further forming a liner oxide layer along the surfaces of the first and second trenches before filling the first and the second trenches.

6. The method according to claim 3, wherein filling the first and second trenches further comprises:

forming an insulating material over the substrate to fill the first and the second trenches; and performing chemical mechanical polishing to remove the insulating material overfilling the first and the second trenches.

7. The method according to claim 3, wherein forming the insulating material includes forming a silicon oxide layer.

8. The method according to claim 3, comprising further annealing to densify the insulating material.

9. The method according to claim 1, wherein forming the first shallow trench isolations comprises forming the first shallow trench isolation with a depth of about 0.1 micron to about 0.3 micron.

10. The method according to claim 1, wherein the step of forming the first shallow trench isolations comprises forming the first shallow trench isolation with a width smaller than about 0.25 micron.

11. The method according to claim 1, wherein the floating gate and the control gate include polysilicon.

12. A structure of a flash memory, comprising:

a substrate having a memory circuit region and a peripheral circuit region, wherein the memory cell region of the substrate having a plurality of first trenches, the peripheral circuit region of the substrate having a plurality of second trenches, the first trenches being shallower than the second trenches;

a plurality of first trench isolation layers, wherein each of the first isolation layers is located in a part of each of the first trenches; a plurality of second shallow trench isolation layers, wherein the second shallow trench isolation layers are located in the second trenches;

a plurality of stacked gates on the substrate in the memory circuit region along a direction perpendicular to the first shallow trench isolations; and a plurality of common source regions and drain regions in the substrate between every alternate pair of the stacked gates;

wherein each of the first shallow trench isolation layers is formed on a side where the drain regions are formed.

13. The structure according to claim 12, wherein the first and second shallow trench isolations have rounded surfaces.

14. The structure according to claim 12, wherein the first shallow trench isolations have a depth of about 0.1 micron to about 0.3 micron.

15. The structure according to claim 12, wherein the first shallow trench isolations each have a width less than about 0.25 micron.

16. The structure according to claim 12, wherein the first and second shallow trench isolations comprise silicon oxide.

17. The structure according to claim 12, wherein a linear oxide layer is formed conformal to surfaces of the first and second shallow trench isolations.

18. The structure according to claim 12, wherein each of the stacked gates further comprises a tunneling oxide layer, a floating gate, a dielectric layer and a control gate.

19. The structure according to claim 18, wherein the floating and control gates comprise polysilicon.

20. The structure according to claim 18, wherein the dielectric layers comprise a composite layer of oxide/nitride/oxide.

* * * * *